United States Patent
Huang

(10) Patent No.: US 10,128,373 B2
(45) Date of Patent: Nov. 13, 2018

(54) METAL OXIDE SEMICONDUCTOR DEVICE HAVING RECESS AND MANUFACTURING METHOD THEREOF

(71) Applicant: RICHTEK TECHNOLOGY CORPORATION, Chupei, HsinChu (TW)

(72) Inventor: Tsung-Yi Huang, Hsinchu (TW)

(73) Assignee: RICHTEK TECHNOLOGY CORPORATION, Chupei, Hsinchu (TW)

( * ) Notice: Subject to any disclaimer, the term of this patent is extended or adjusted under 35 U.S.C. 154(b) by 0 days.

(21) Appl. No.: 15/585,949

(22) Filed: May 3, 2017

(65) Prior Publication Data
US 2018/0190819 A1    Jul. 5, 2018

(30) Foreign Application Priority Data
Jan. 4, 2017  (TW) .............................. 106100099 A

(51) Int. Cl.
| H01L 29/66 | (2006.01) |
| --- | --- |
| H01L 29/78 | (2006.01) |
| H01L 29/06 | (2006.01) |
| H01L 23/535 | (2006.01) |
| H01L 21/768 | (2006.01) |

(52) U.S. Cl.
CPC .... *H01L 29/7834* (2013.01); *H01L 21/76895* (2013.01); *H01L 23/535* (2013.01); *H01L 29/0653* (2013.01); *H01L 29/6659* (2013.01); *H01L 29/66636* (2013.01)

(58) Field of Classification Search
None
See application file for complete search history.

(56) References Cited

U.S. PATENT DOCUMENTS

| 2005/0035408 | A1* | 2/2005 | Wang ................. H01L 29/0649 257/344 |
| 2006/0065928 | A1* | 3/2006 | Nagai .................. H01L 29/402 257/344 |
| 2006/0076619 | A1* | 4/2006 | Wang .................. H01L 29/0649 257/336 |
| 2007/0298573 | A1* | 12/2007 | Lin .................... H01L 21/28097 438/300 |
| 2008/0188048 | A1* | 8/2008 | Nagai .................. H01L 29/402 438/286 |
| 2013/0045577 | A1* | 2/2013 | Huang ............. H01L 21/82385 438/225 |
| 2013/0161754 | A1* | 6/2013 | Su ................. H01L 21/823807 257/369 |

(Continued)

*Primary Examiner* — Alexander Ghyka
(74) *Attorney, Agent, or Firm* — Tung & Associates

(57) ABSTRACT

The present invention provides a MOS (Metal-Oxide-Silicon) device and a manufacturing method thereof. The MOS device includes: a semiconductor substrate, a gate, a source, a drain, and two LDDs (Lightly-Doped-Drains). At least one recess is formed at an upper surface of the semiconductor substrate. The recess has a depth which is deeper than the depth of the two LDDs. The recess is filled with a conductive material. A vertical connection portion is formed at a boundary of the recess in the vertical direction, to at least connect one of the LDDs to the drain. The LDD closer to the drain is not laterally in contact with the drain but is connected to the drain by the vertical direction.

8 Claims, 11 Drawing Sheets

(56) References Cited

U.S. PATENT DOCUMENTS

| | | | |
|---|---|---|---|
| 2014/0252472 A1* | 9/2014 | Chen | H01L 29/7816 257/339 |
| 2015/0028417 A1* | 1/2015 | Huang | H01L 21/266 257/339 |
| 2015/0091087 A1* | 4/2015 | Huang | H01L 29/6659 257/336 |

* cited by examiner

US 10,128,373 B2

METAL OXIDE SEMICONDUCTOR DEVICE HAVING RECESS AND MANUFACTURING METHOD THEREOF

CROSS REFERENCE

The present invention claims priority to TW 106100099, filed on Jan. 4, 2017.

BACKGROUND OF THE INVENTION

Field of Invention

The present invention relates to a metal oxide semiconductor (MOS) device having recess and a manufacturing method thereof; particularly, it relates to such a MOS device having a reduced electric field to suppress the hot carrier effect, whereby the substrate current generated due to the hot carrier effect is suppressed without affecting the threshold voltage and the ON-resistance, and a manufacturing method of the MOS device.

Description of Related Art

Please refer to FIGS. 1A-1E, which show, by cross-section views, manufacturing process steps of a prior art N-type MOS device. As shown in FIGS. 1A-1E, first, isolation structures 12al and 12ar are formed in a substrate 11 to define a device region 100; and a P-type well 12b, a gate 13, a lightly doped diffusion (LDD) 14, a source 15a and a drain 15b are formed in the device region 100. The P-type well 12b can be the substrate 11 itself if the substrate 11 is P-type. The gate 13 includes a dielectric layer 13a, an electrode layer 13b and a spacer layer 13c. The LDD 14, the drain 15b and the source 15a are formed by a lithography process and an ion implantation process, wherein the lithography process defines the implantation regions, and the ion implantation process implants N-type impurities to the defined regions.

This prior art N-type MOS device has a drawback: because the concentration of the N-type impurities of the source 15a and the drain 15b is higher than the concentration of the N-type impurities of the two LDDs 14, and because the source 15a and the drain 15b are in contact with the two LDDs 14 respectively in the lateral direction, certain N-type impurities in the source 15a will diffuse to the LDD 14 connected to the source 15a. As a result, when an electric field is applied, a hot carrier effect will occur to lower the threshold voltage (Vt) of this prior art N-type MOS device, such that the device cannot operate as designed.

In view of the above, to overcome the drawback in the prior art, the present invention proposes a MOS device having recess and a manufacturing method thereof, which are capable of reducing the electric field to suppress hot carrier effect, whereby the substrate current generated due to the hot carrier effect is suppressed without affecting the threshold voltage and the ON-resistance of the MOS device.

SUMMARY OF THE INVENTION

From one perspective, the present invention provides a MOS device, comprising: a semiconductor substrate, in which are formed a plurality of isolation structures substantially parallel to each other in a longitudinal direction, to define a device region, the semiconductor substrate having an upper surface and a lower surface opposing to each other in a vertical direction, wherein a first recess and a second recess are formed on the upper surface, the first recess and the second recess being substantially parallel to each other in the longitudinal direction; a gate, which is in the device region and on the upper surface of the semiconductor substrate; a source and a drain, which are at different sides of the gate, respectively; two lightly doped diffusions (LDDs) having a same conductive type as the source and the drain, which are at different sides of the gate, respectively; two vertical connection portions which connect the two LDDs to the source and the drain, respectively; and contacts formed by a conductive material in the first recess and the second recess, respectively, wherein, viewing from a cross-section view, the first recess and the second recess are at different sides of the gate and are located between the gate and one of the isolation structures, respectively; wherein, the first recess, in a lateral direction, has a first boundary closer to the gate and a second boundary farther from the gate, and the second recess, in the lateral direction, has a third boundary closer to the gate and a fourth boundary farther from the gate, the vertical connection portion of the source being formed at the first boundary of the first recess in the vertical direction, while the vertical connection portion of the drain being formed at the third boundary of the second recess in the vertical direction; wherein, the first boundary and the third boundary, in the lateral direction, do not extend beneath the gate; wherein, from the cross-section view, the first recess and the second recess have respective depths, and the two LDDs have a depth, and the depths of the first recess and the second recess are both deeper than the depth of the two LDDs; wherein, depth is defined as a distance extending from the upper surface of the semiconductor substrate downward in the vertical direction; and wherein, the longitudinal direction, vertical direction and lateral direction are perpendicular to one another.

From another perspective, the present invention provides a manufacturing method of a MOS device, comprising the steps of: providing a semiconductor substrate, and forming a plurality of isolation structures substantially parallel to each other in a longitudinal direction of the semiconductor substrate to define a device region, the semiconductor substrate having an upper surface and a lower surface opposing to each other in a vertical direction; forming a gate in the device region and on the upper surface of the semiconductor substrate; etching the upper surface in the longitudinal direction, so that a first recess and a second recess are formed on the upper surface, wherein the first recess and the second recess are substantially parallel to each other in the longitudinal direction; forming two lightly doped diffusions (LDDs) having a same conductive type as the source and the drain at different sides below the gate, respectively; forming a source and a drain at different sides of the gate; forming two vertical connection portions which connect the two LDDs to the source and the drain, respectively; and filling a conductive material into the first recess and the second recess, respectively, to form contacts; wherein, viewing from a cross-section view, the first recess and the second recess are at different sides of the gate and are located between the gate and one of the isolation structures, respectively; wherein, the first recess, in a lateral direction, has a first boundary closer to the gate and a second boundary farther from the gate, and the second recess, in the lateral direction, has a third boundary closer to the gate and a fourth boundary farther from the gate, the vertical connection portion of the source being formed at the first boundary of the first recess in the vertical direction, while the vertical connection portion of the drain being formed at the third boundary of the second recess in the vertical direction;

wherein, the first boundary and the third boundary, in the lateral direction, do not extend beneath the gate; wherein, from the cross-section view, the first recess and the second recess have respective depths, and the two LDDs have a depth, and the depths of the first recess and the second recess are both deeper than the depth of the two LDDs; wherein, depth is defined as a distance extending from the upper surface of the semiconductor substrate downward in the vertical direction; and wherein, the longitudinal direction, vertical direction and lateral direction are perpendicular to one another.

In one embodiment, the two LDDs are not laterally in contact with the source and the drain, respectively.

In one embodiment, from the cross-section view, the respective depths of the first recess and the second recess are not deeper than a depth of the isolation structures.

In one embodiment, from the cross-section view, the respective depths of the first recess and the second recess are not deeper than 5000 Å.

In one embodiment, the isolation structures include local oxidation of silicon (LOCOS) structures or shallow trench isolation (STI) structures.

From yet another perspective, the present invention provides a MOS device, comprising: a semiconductor substrate, in which are formed a plurality of isolation structures substantially parallel to each other in a longitudinal direction, to define a device region, the semiconductor substrate having an upper surface and a lower surface opposing to each other in a vertical direction, wherein a recess is formed on the upper surface; a gate, which is in the device region and on the upper surface of the semiconductor substrate; a source and a drain, which are at different sides of the gate, respectively; two lightly doped diffusions (LDDs) having a same conductive type as the source and the drain, which are at different sides of the gate, respectively; a vertical connection portion which connects one of the two LDDs to the drain; and a contacts formed by a conductive material in the recess, wherein, viewing from a cross-section view, the recess is at one side of the gate and is located between the gate and one of the isolation structures; wherein, the recess, in a lateral direction, has a first boundary closer to the gate and a second boundary farther from the gate, the vertical connection portion being formed at the first boundary of the recess in the vertical direction, and wherein the first boundary, in the lateral direction, does not extend beneath the gate; wherein the recess has a depth which is deeper than a depth of one of the two LDDs which is at the same side as the drain; wherein, depth is defined as a distance extending from the upper surface of the semiconductor substrate downward in the vertical direction; and wherein, the longitudinal direction, vertical direction and lateral direction are perpendicular to one another.

From still another perspective, the present invention provides a manufacturing method of a MOS device, comprising the steps of: providing a semiconductor substrate, and forming a plurality of isolation structures substantially parallel to each other in a longitudinal direction of the semiconductor substrate to define a device region, the semiconductor substrate having an upper surface and a lower surface opposing to each other in a vertical direction; forming a gate in the device region and on the upper surface of the semiconductor substrate; etching the upper surface in the longitudinal direction, so that a recess is formed on the upper surface; forming two lightly doped diffusions (LDDs) having a same conductive type as the source and the drain at different sides below the gate, respectively; forming a source and a drain at different sides of the gate; forming a vertical connection portion which connects one of the two LDDs to the drain; and filling a conductive material into the recess to form a contact; wherein, viewing from a cross-section view, the recess is at one side of the gate and is located between the gate and one of the isolation structures; wherein, the recess, in a lateral direction, has a first boundary closer to the gate and a second boundary farther from the gate, the vertical connection portion being formed at the first boundary of the recess in the vertical direction, and wherein the first boundary, in the lateral direction, does not extend beneath the gate; wherein the recess has a depth which is deeper than a depth of one of the two LDDs which is at the same side as the drain; wherein, depth is defined as a distance extending from the upper surface of the semiconductor substrate downward in the vertical direction; and wherein, the longitudinal direction, vertical direction and lateral direction are perpendicular to one another.

In one embodiment, one of the two LDDs which is at the same side as the drain is not laterally in contact with the drain, and wherein another one of the two LDDs which is at the same side as the source is laterally in contact with the source.

In one embodiment, the depth of the recess is not deeper than a depth of the isolation structures.

In one embodiment, the depth of the recess is not deeper than 5000 Å.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be will be better understood with regard to the detailed description of the embodiments below, with reference to the drawings. The drawings as referred to throughout the description of the present invention are for illustration only, to show the interrelations between the apparatus and devices, but not drawn according to actual scale.

Two types of MOS devices and manufacturing methods thereof are illustrated below, as examples to show how the present invention reduces the electric field, so that the hot carrier effect can be suppressed to reduce the substrate current.

In a first example, the present invention provides a MOS device 20 having two recesses. In this embodiment, these two recesses are located in correspondence with the source and the drain of the MOS device 20, respectively (i.e., the two recesses are located at different sides of the gate, referring to FIGS. 2A-2G).

In a second example, the present invention provides a MOS device 30 having only one recess. In this embodiment, the single one recess is at the same side (the same side relative to the gate) as the drain of the MOS device 30 (referring to FIGS. 3A-3G).

Figure 2A:
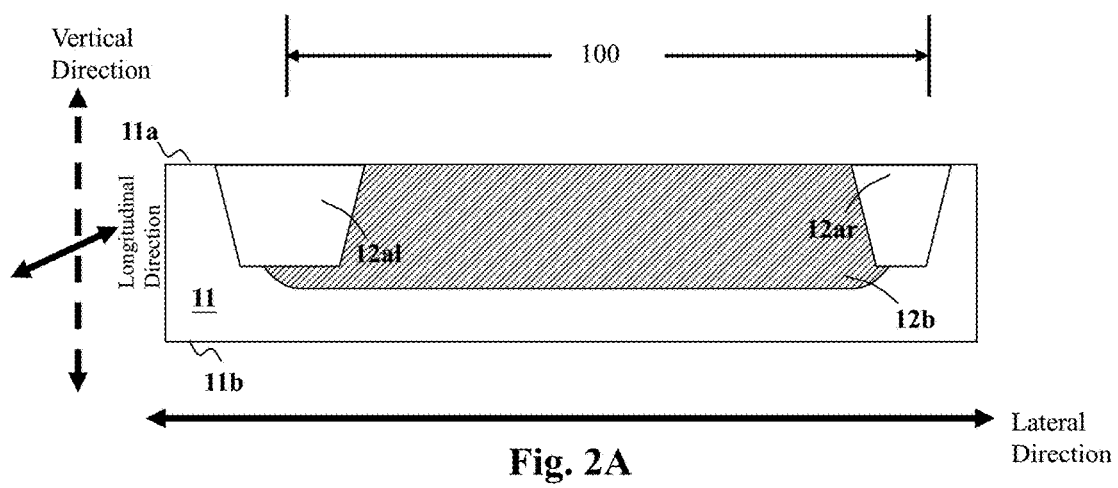
FIGS. 2A-2G show a first embodiment according to the present invention.

Please refer to FIGS. 2A-2G, which show a first embodiment according to the present invention, wherein an N-type MOS device is illustrated as an example. In the figures, the vertical direction, lateral direction and longitudinal direction are perpendicular to one another. As shown in FIG. 2A, a semiconductor substrate 11 is provided, in which are formed a P-type well 12b and two isolation structures 12al and 12ar which are substantially parallel to each other in a longitudinal direction, to define the device region 100. As shown in FIG. 2A, the semiconductor substrate 11 has an upper surface 11a and a lower surface 11b opposing to each other in the vertical direction. In one embodiment, the isolation structures 12al and 12ar are, for example but not limited to, shallow trench isolation (STI) structures as shown in the figure. In another embodiment, the isolation structures 12al and 12ar are, for example but not limited to, local oxidation of silicon (LOCOS) structures as shown in the figure.

Figure 2B:
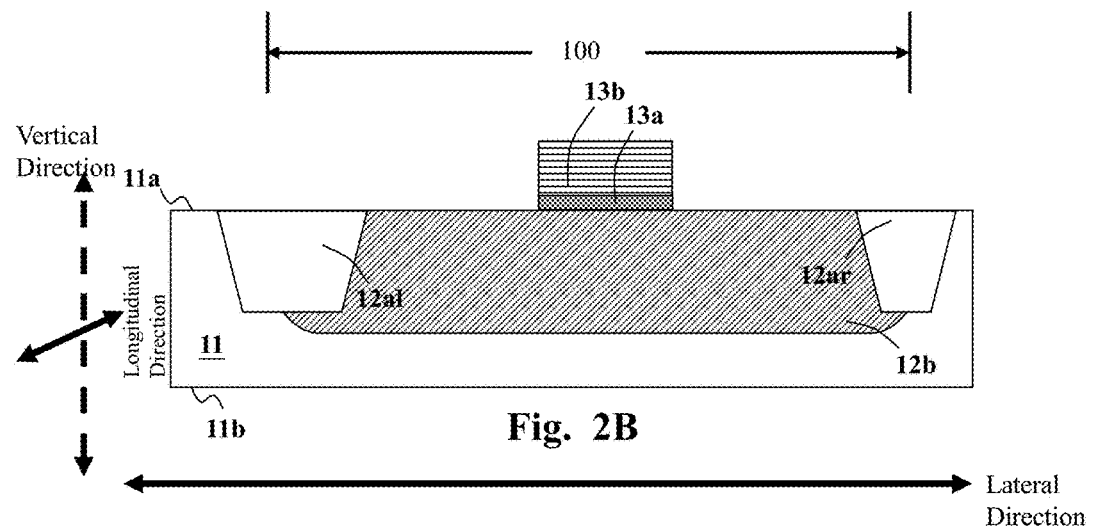

Next, as shown in FIG. 2B, a dielectric layer 13a and an electrode layer 13b are formed in the device region 100 on the upper surface 11a of the semiconductor substrate 11 by lithography and etching.

Figure 1A:
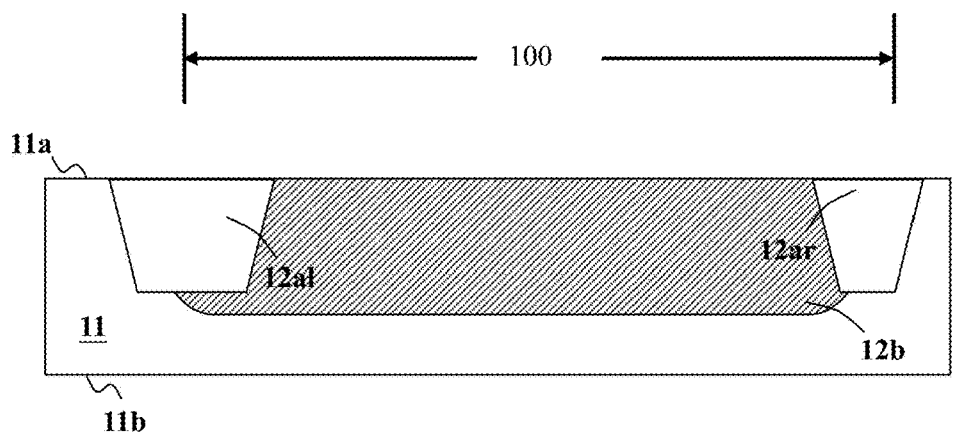
FIGS. 1A-1E show, by cross-section views, manufacturing process steps of a prior art N-type MOS device.
Figure 1B:
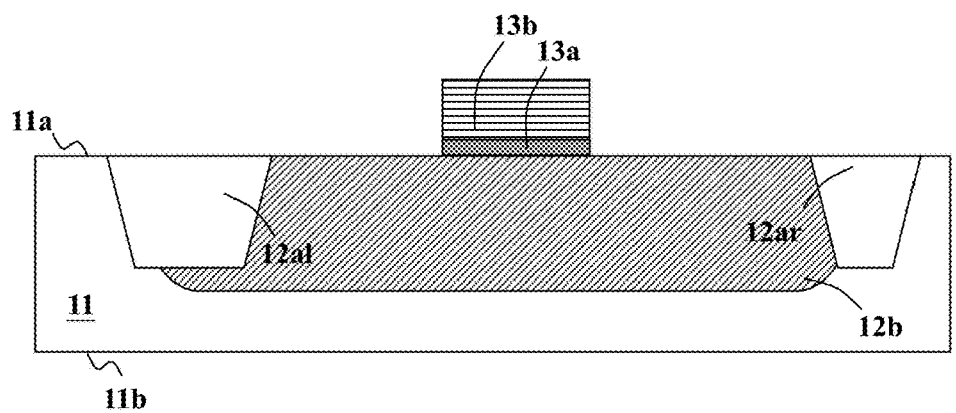
Figure 1C:
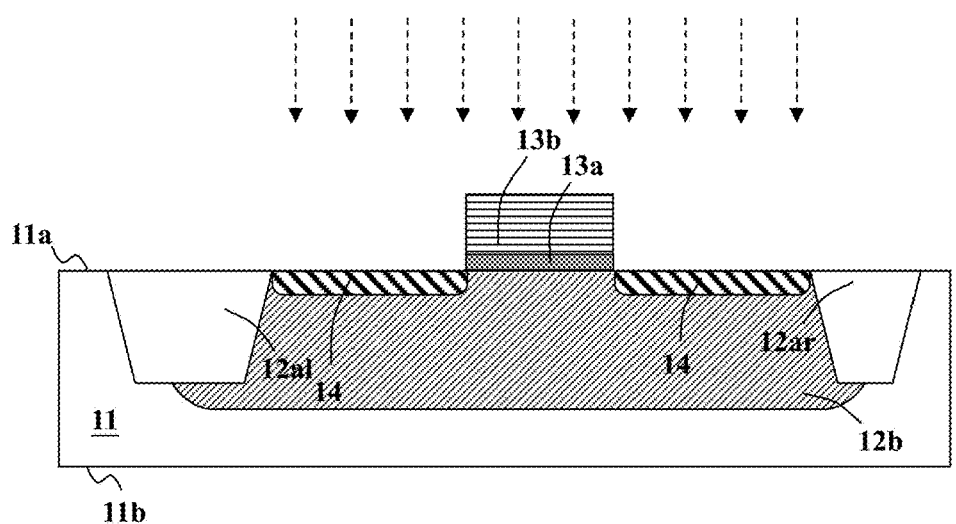
Figure 1D:
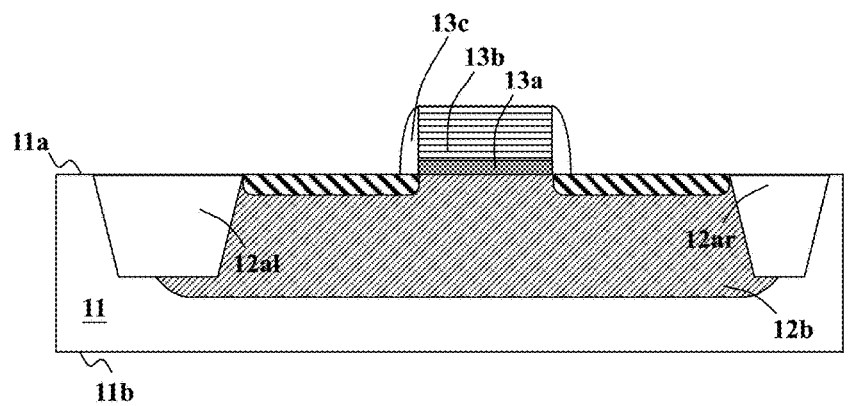
Figure 1E:
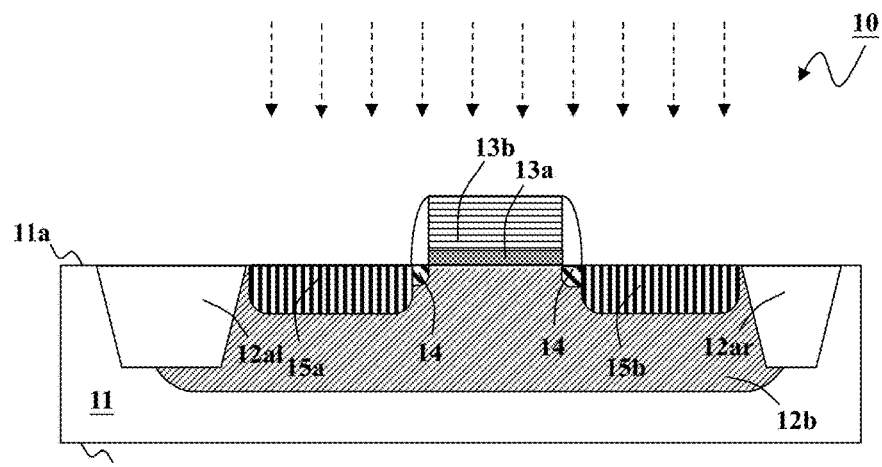
Figure 2C:
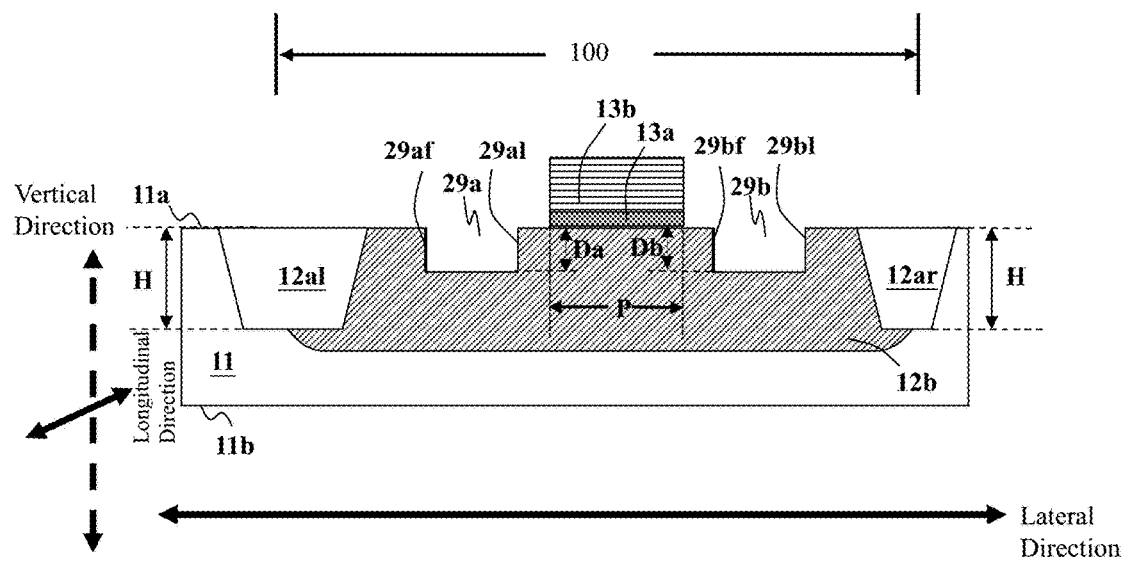

The present invention is different from the prior art in that: as shown in FIG. 2C, the upper surface 11a is etched in the longitudinal direction to form a recess 29a and a recess 29b on the upper surface 11a of the semiconductor substrate 11. Preferably, the recess 29a and the recess 29b are substantially parallel to each other in the longitudinal direction. In contrast, in the prior art device formed by the steps of FIGS. 1A-1E, no etching step is taken to form any recess on the upper surface 11a.

The recess 29a and recess 29b on the upper surface 11a for example can be formed by: forming and patterning a mask (not shown) on the upper surface 11a of the semiconductor substrate 11, and performing an etching step according to the mask. The mask protects the regions other than the recess 29a and the recess 29b from etching. In one embodiment, the etching step can be, for example but not limited to, HF (hydrogen fluoride) vapor etch. In another embodiment, the etching step for example can be BOE (buffered oxide etch) by immersing the semiconductor substrate 11 in an acid tank. The mask can be, for example but not limited to, a photoresist layer patterned by lithography, or a hard mask made of a single or composite material, such as metal, silicide or amorphous silicon.

In one embodiment, the etching step of the semiconductor substrate 11 can be, for example but not limited to, an isotropic etch by XeF2 gas. In another embodiment, an anisotropic etch step can be taken to etch the semiconductor substrate 11, such as an ICP (Inductively Coupled Plasma) etch.

Figure 2D:
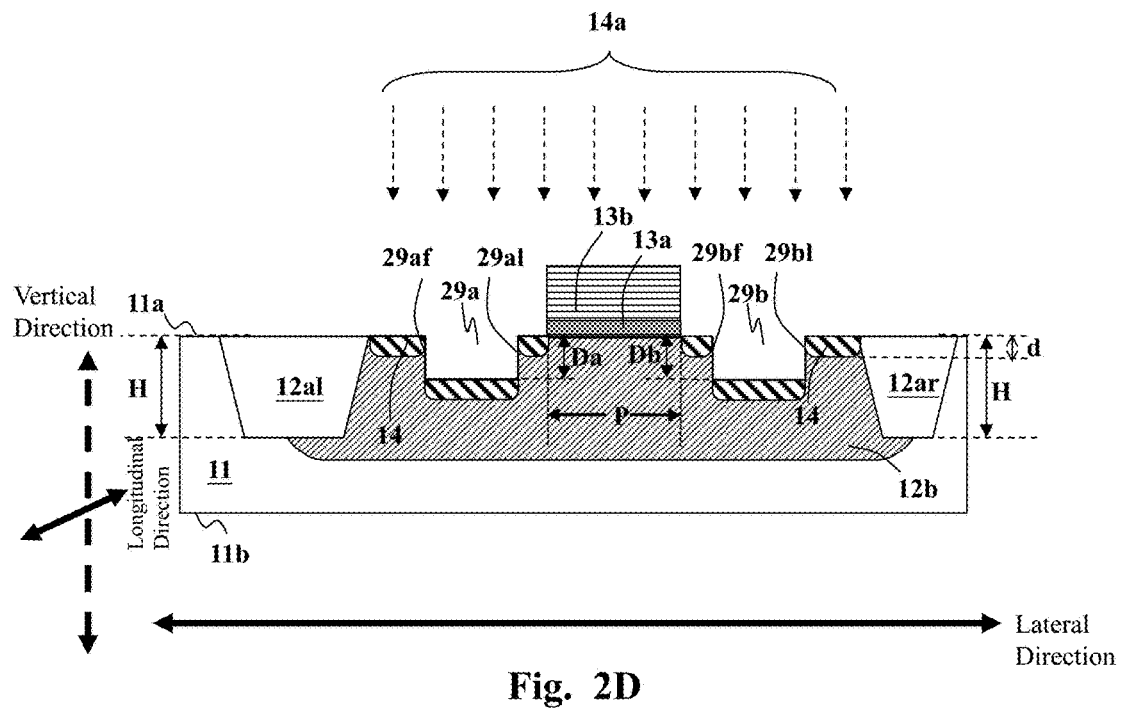

Next, as shown in FIG. 2D, the isolation structures 12al and 12ar and the electrode layer 13b are used as a mask, and N-type impurities are doped into the semiconductor substrate 11 to form two N-type two lightly doped diffusions (LDDs) 14 at different sides of the electrode layer 13b. The two N-type LDDs 14 for example can be formed by an ion implantation process, which implants N-type impurities to the defined regions of the semiconductor substrate 11 (as shown by the dashed arrows 14a illustrated in this figure).

It is noteworthy that, as shown in FIG. 2D, from a cross-section view, the recess 29a and the recess 29b of this embodiment have respective depths Da and Db while the two LDDs 14 have a depth d (wherein "depth" is defined as a distance extending from the upper surface 11a of the semiconductor substrate 11 downward in the vertical direction), and the depths Da and the depth Db are both deeper than the depth d. That is, in this embodiment, Da>d, and, Db>d.

Figure 2E:
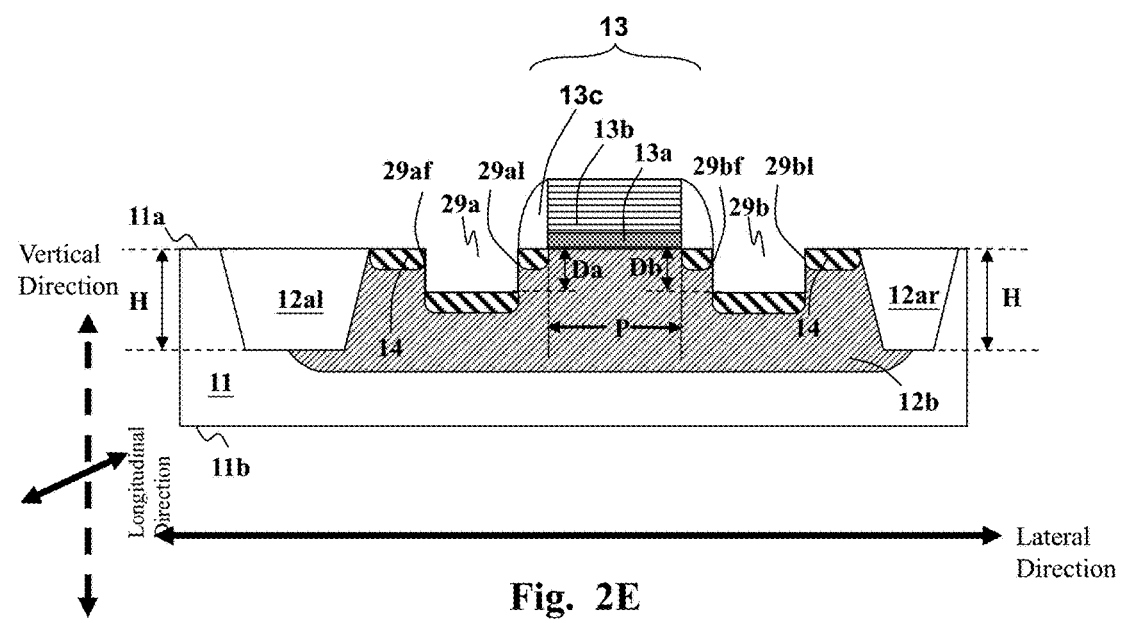

Next, as shown in FIG. 2E, a spacer layer 13c is formed at the outer sides of the dielectric layer 13a and the electrode layer 13b by, for example but not limited to, thin film deposition and self-alignment etching, so that a gate 13 is formed.

As shown in FIG. 2E, the recess 29a and the recess 29b of this embodiment, as seen from the cross-section view, are at different sides of the gate 13 and are lower than the dielectric layer 13a of the gate 13; and, the recess 29a and the recess 29b are located between the gate 13 and the isolation structures 12al and 12ar, respectively. That is, from the cross-section view, the recess 29a of this embodiment is at one side of the gate 13 and lower than the dielectric layer 13a of the gate 13, and is located between the gate 13 and the isolation structures 12al; the recess 29b of this embodiment is at the other side of the gate 13 and lower than of the dielectric layer 13a of the gate 13, and is located between the gate 13 and the isolation structures 12ar.

As shown in FIG. 2E, in the lateral direction, the recess 29a has a boundary 29al closer to the gate 13 and a boundary 29af farther from the gate 13. In this embodiment, the boundary 29al of the recess 29a, in the lateral direction, does not extend into an area P beneath the dielectric layer 13a of the gate 13. Besides, the boundary 29af of the recess 29a, in the lateral direction, does not extend beneath the isolation structure 12al. Moreover, in the lateral direction, the recess 29b has a boundary 29bf closer to the gate 13 and a boundary 29bl farther from the gate 13. Similarly, in this embodiment, the boundary 29bf of the recess 29b, in the lateral direction, does not extend into the area P beneath the dielectric layer 13a of the gate 13, and the boundary 29bl of the recess 29b, in the lateral direction, does not extend beneath the isolation structure 12ar.

As shown in FIG. 2E, the recess 29a and the recess 29b of this embodiment, from the cross-section view, have depths Da and Db respectively, wherein "depth" is defined as a distance extending from the upper surface 11a of the semiconductor substrate 11 downward in the vertical direction. The isolation structures 12al and 12ar of this embodiment, from the cross-section view, have a depth H, which is also defined as a distance extending from the upper surface 11a of the semiconductor substrate 11 downward in the vertical direction. It is noteworthy that, the depth Da and the depth Db are both not deeper than the depth H. That is, in one embodiment, Da≤H, and, Db≤H. In another embodiment, the depth Da and the depth Db are both not deeper than 5000 angstrom (Å) ($10^{-10}$ m). That is, in this embodiment, Da≤5000 angstrom (Å), and, Db≤5000 angstrom (Å).

Figure 2F:
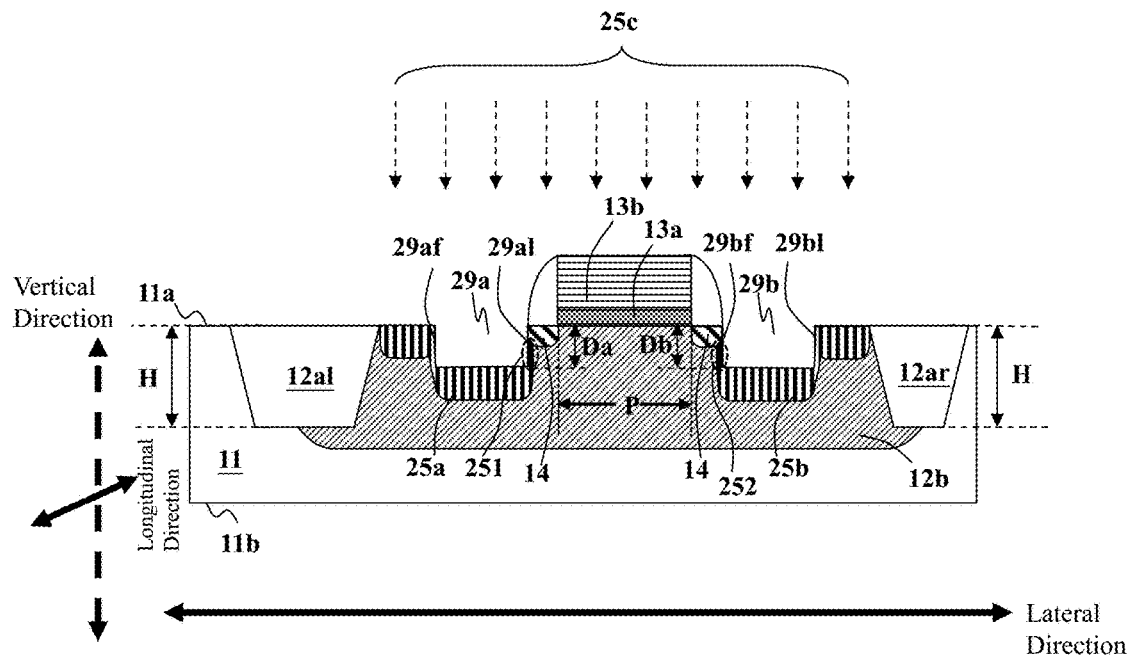

Next, as shown in FIG. 2F, the source 25a and the drain 25b are formed under the upper surface 11a of the semiconductor substrate 11 in the device region 100, at different sides of the gate 13 by a lithography process and an ion implantation process as shown by the dashed arrows 25C illustrated in this figure, wherein the lithography process defines the implantation regions by a photoresist mask together with a self-alignment effect provided by both or a part of the gate 13 and the isolation structures 12a and 12ar, and the ion implantation process implants N-type impurities to form the source 25a and the drain 25b which are in contact with the two N-type LDDs 14 respectively.

It is noteworthy that the present invention is further different from the prior art in that: as shown in FIG. 2F, from the cross-section view, there is a vertical connection portion 251 (as shown by a dashed circle in FIG. 2F) formed by the implantation at the boundary 29al of the recess 29a in the vertical direction. This vertical connection portion 251 connects the LDD 14 which is at the same side as the source 25a to the source 25a. Besides, from the cross-section view, there is a vertical connection portion 252 (as shown by another dashed circle in FIG. 2F) formed by the implantation at the boundary 29bf of the recess 29b in the vertical direction. This vertical connection portion 252 connects the LDD 14 which is at the same side as the drain 25b to the drain 25b.

It is noteworthy that, as shown in FIG. 2F, from the cross-section view, the LDD 14 which is at the same side as the source 25a is not laterally in contact with the source 25a. Besides, from the cross-section view, the LDD 14 which is at the same side as the drain 25b is not laterally in contact with the drain 25b.

Figure 2G:
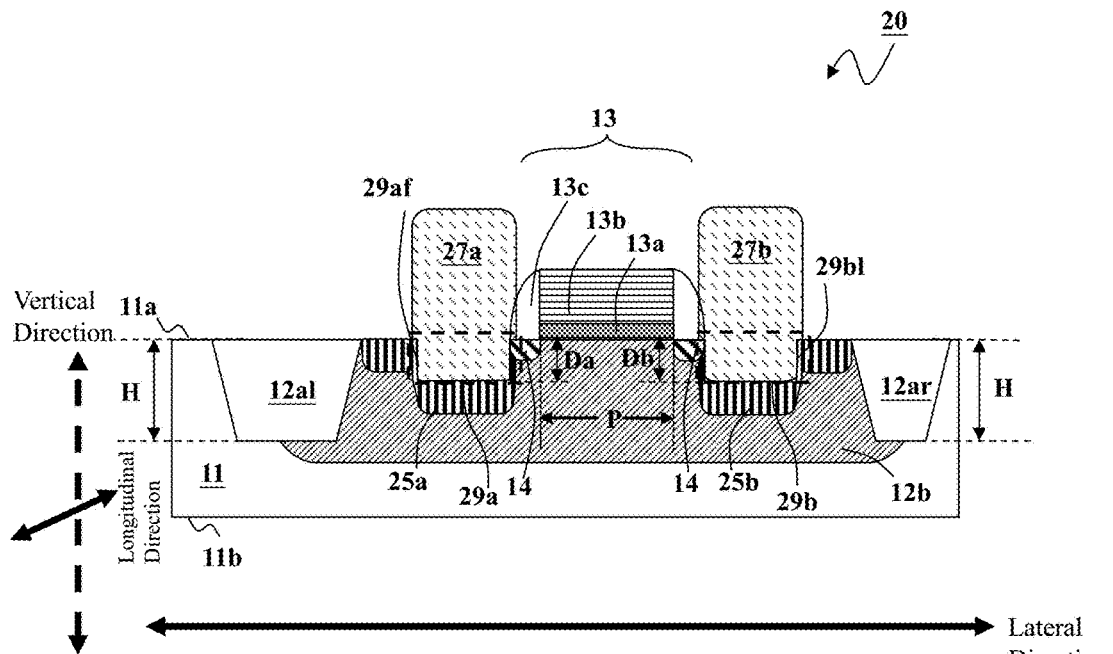

Next, as shown in FIG. 2G, a conductive material 27a is filled into the recess 29a, to form a contact. Also, a conductive material 27b is filled into the recess 29b, to form a contact.

FIG. 2G shows a cross-section view of the MOS device 20 after the above manufacturing process steps are completed.

In this embodiment, because the two LDDs 14 are not laterally in contact with the source 25a and the drain 25b, the amount of N-type impurities in the source 25a which diffuse to the LDD 14 at the same side as the source 25a and the amount of N-type impurities in the drain 25b which diffuse to the LDD 14 the same side as the drain 25b are reduced dramatically. As a consequence, when an electric field is applied to the MOS device 20, the hot carrier effect will be suppressed, whereby the substrate current flowing from the drain to the semiconductor substrate 11 due to the hot carrier effect is suppressed. Hence, the threshold voltage of the MOS device 20 will not deviate from the designed value.

Figure 4:
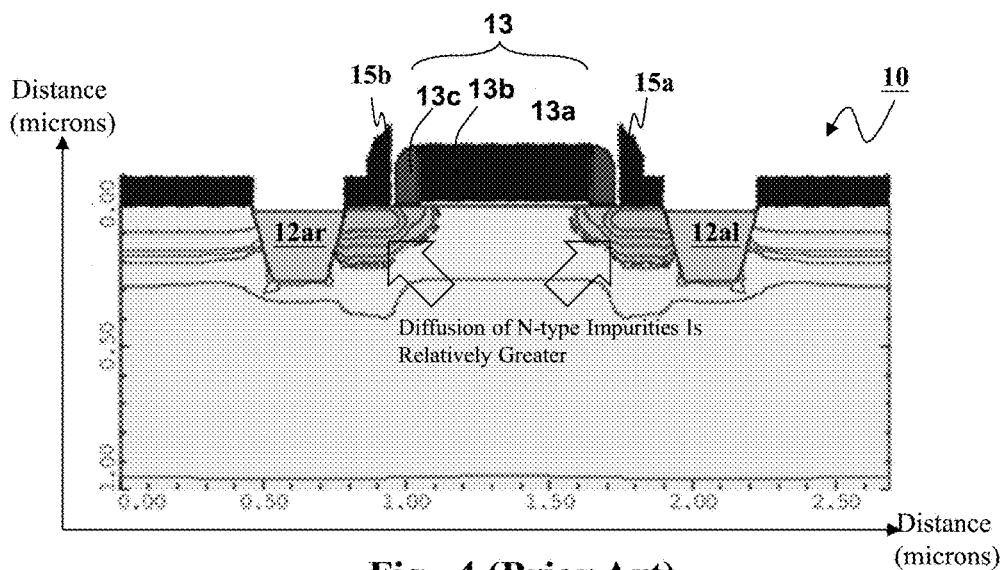
FIG. 4 shows a diagram of dopant concentration profile of a prior art N-type MOS device 10 corresponding to FIG. 1E.
Figure 5:
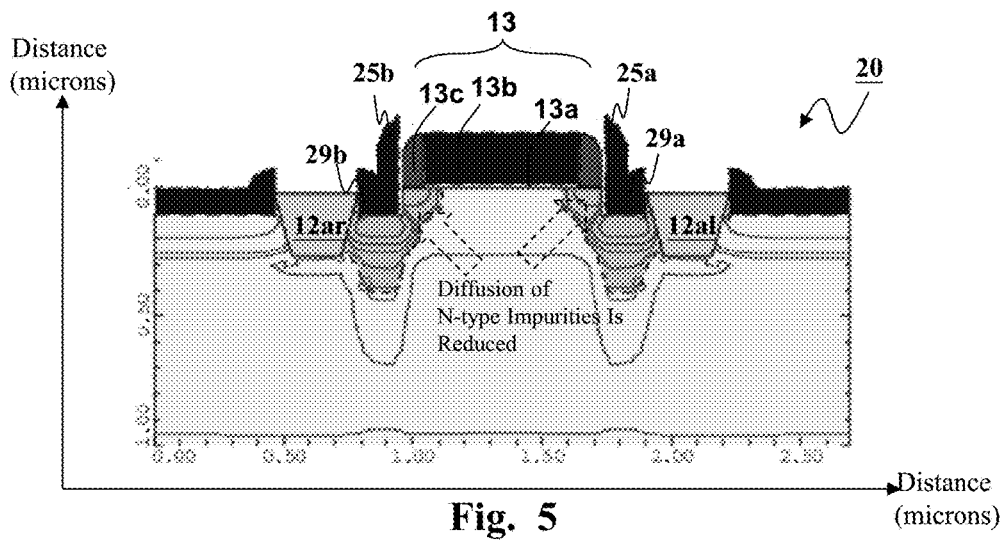
FIG. 5 shows a diagram of dopant concentration profile of a MOS device 20 according to the present invention, which corresponds to FIG. 2G.

Please refer to FIG. 2G in conjugation with FIGS. 1E, 4 and 5. FIG. 4 shows a diagram of dopant concentration profile of the prior art N-type MOS device 10 corresponding to FIG. 1E. FIG. 5 shows a diagram of dopant concentration profile of the MOS device 20 corresponding to FIG. 2G. As shown in FIG. 4, in the prior art N-type MOS device 10, the amount of N-type impurities in the source 15a which diffuse to the LDD 14 connected to the source 15a and the amount of N-type impurities in the drain 15b which diffuse to the LDD 14 connected to the drain 15b are relatively higher (as indicated by the hollow arrow in solid line shown in FIG. 4).

However, note that the present invention is different from the prior art in that: in the MOS device 20, the amount of N-type impurities in the source 25a which diffuse to the LDD 14 at the same side as the source 25a and the amount of N-type impurities in the drain 25b which diffuse to the LDD 14 at the same side as the drain 25b are dramatically reduced (as indicated by the hollow arrow in dashed line shown in FIG. 5).

An N-type device is illustrated as an example in the above embodiment of FIGS. 2A-2G, but the same concept is certainly applicable to a P-type device.

In the above-mentioned embodiment, the MOS device 20 includes two recesses 29a and 29b, which are respectively at the same sides as the source 25a and as the drain 25b of the MOS device 20.

In another embodiment, the present invention provides another MOS device 30, which includes only one recess instead of two recesses. In particular, this single one recess is at the same side as the drain of the MOS device 30.

Please refer to FIGS. 3A-3G, which show this embodiment according to the present invention, wherein, similarly, an N-type MOS device is illustrated as an example.

The manufacturing steps or the structure of this embodiment is substantially the same as the manufacturing steps or the structure of the above-mentioned embodiment, but is different in that: the above-mentioned MOS device 20 includes two recesses 29a and 29b, whereas, the MOS device 30 of this embodiment includes only one recess 39b. Therefore, the manufacturing steps in this embodiment which are similar to the manufacturing steps of the above-mentioned embodiment will not be redundantly repeated here, and only the distinct features of this embodiment will be described below.

Figure 3A:
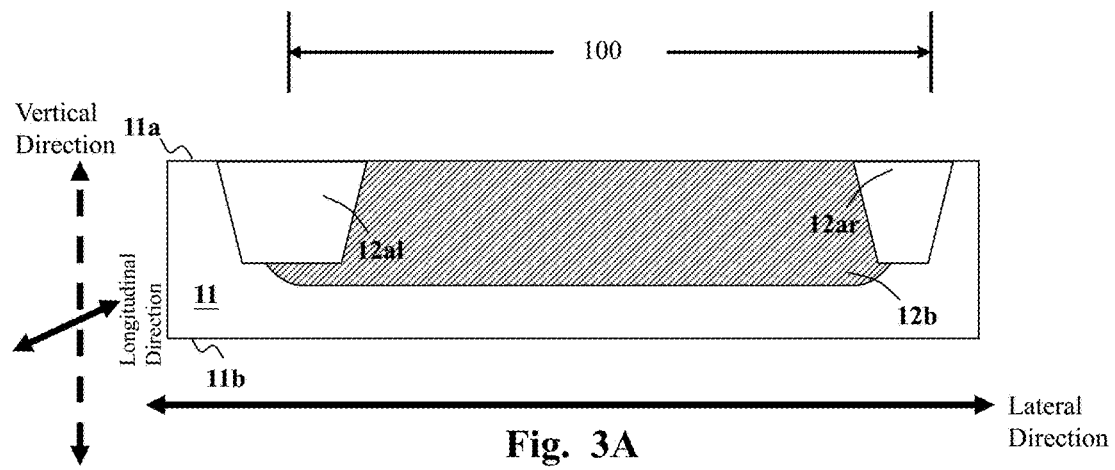
FIGS. 3A-3G show another embodiment according to the present invention.
Figure 3B:
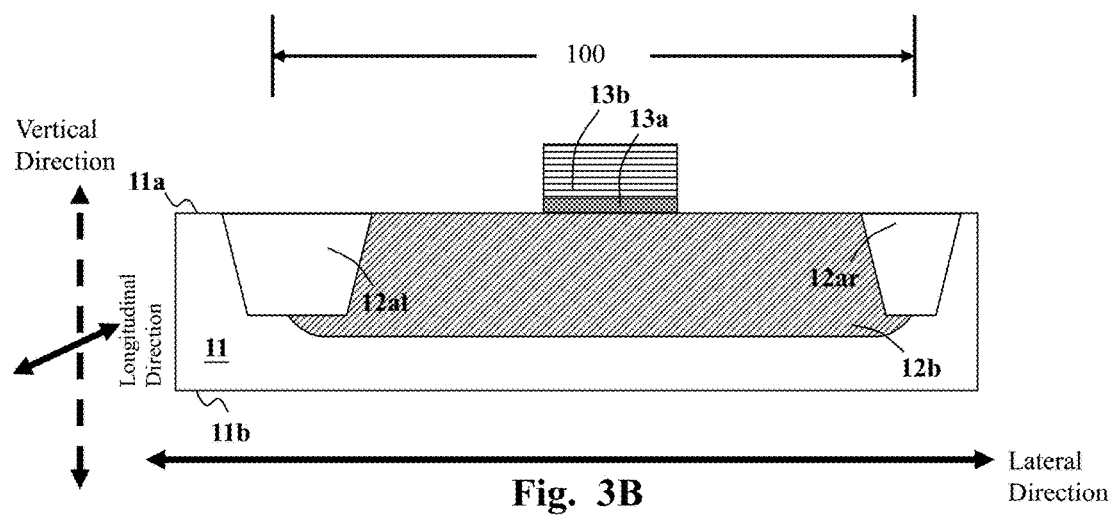
Figure 3C:
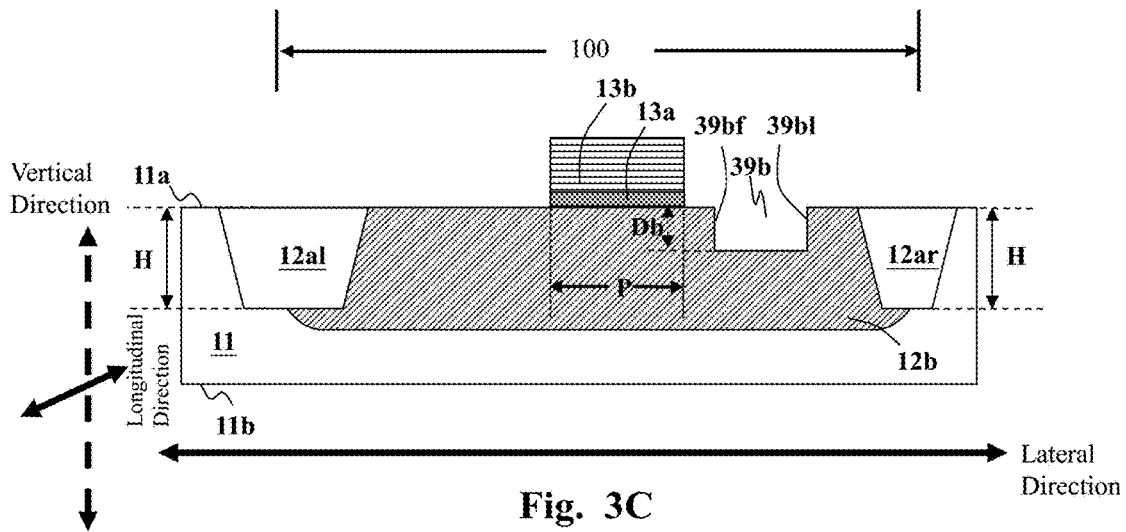

Please refer to FIG. 3C, the present invention is different from the prior art in that: as shown in FIG. 3C, the upper surface 11a is etched in the longitudinal direction to form a recess 39b on the upper surface 11a of the semiconductor substrate 11. In contrast, in the prior art device formed by the steps of FIGS. 1A-1E, no etching step is taken to form any recess on the upper surface 11a.

Figure 3D:
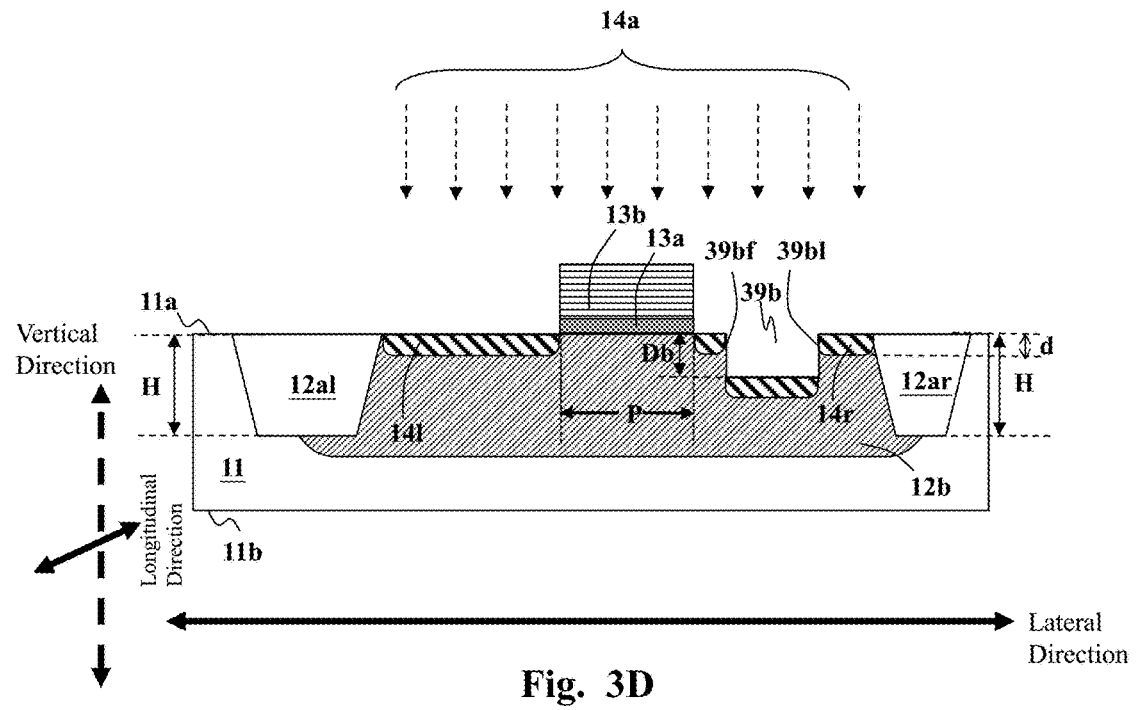

Next, please refer to FIG. 3D. It is noteworthy that, as shown in FIG. 3D, the recess 39b of this embodiment, from a cross-section view, has a depth Db, which is defined as a distance extending from the upper surface 11a of the semiconductor substrate 11 downward in the vertical direction. The LDD 14r (i.e., the LDD 14r which is at the same side as the drain 35b, as shown in FIG. 3F), from the cross-section view, has a depth d, which is also defined as a distance extending from the upper surface 11a of the semiconductor substrate 11 downward in the vertical direction. It is noteworthy that, the depth Db is deeper than the depth d. In other words, in this embodiment, Db>d.

Figure 3E:
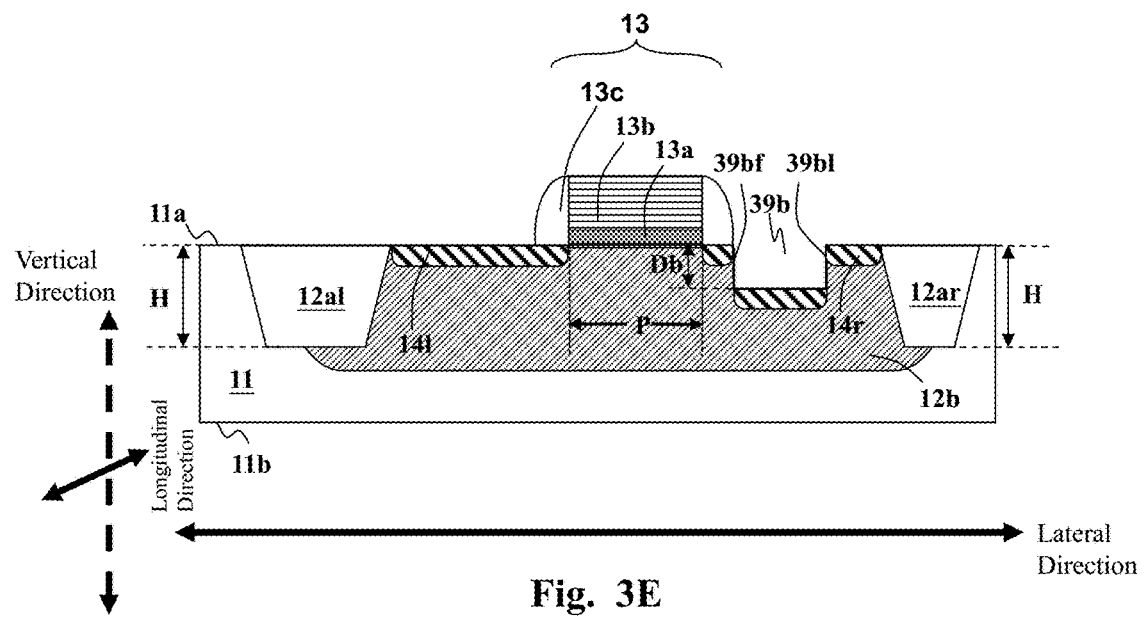
Figure 3F:
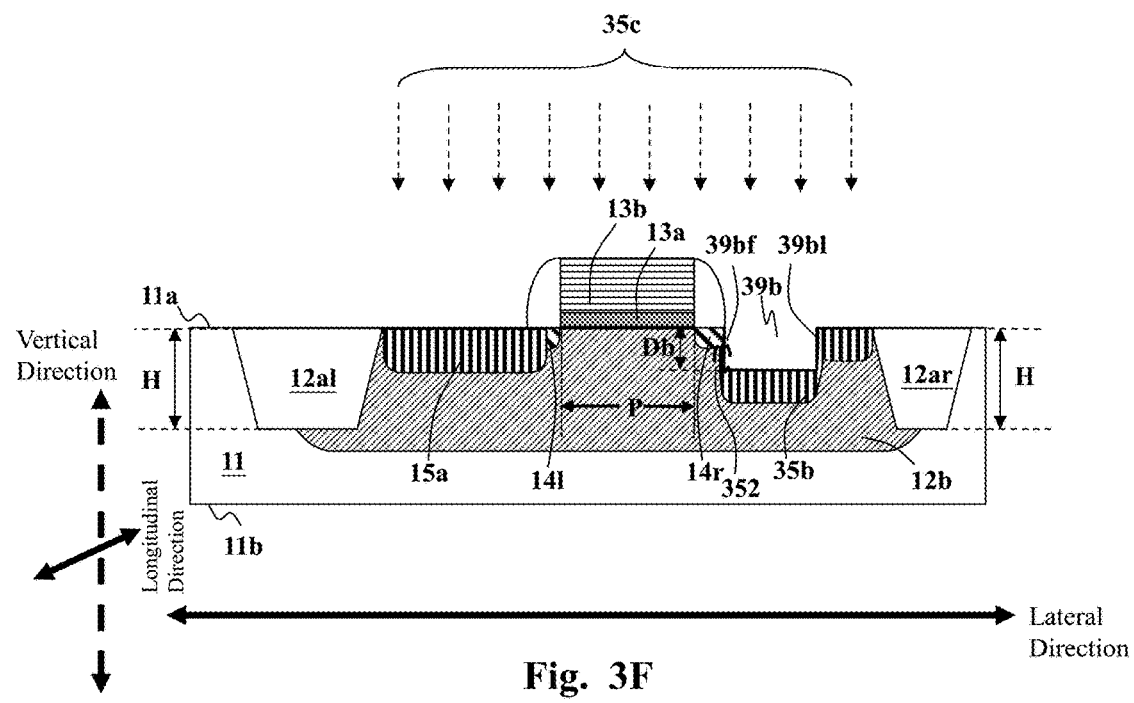

In addition, it is noteworthy that the recess 39b of this embodiment, viewing from the cross-section view of FIG. 3E, is at one side of the gate 13 and lower than the dielectric layer 13a of the gate 13. That is, the recess 39b of this embodiment, viewing from the cross-section view, is at the same side as the drain 35b (as shown in FIG. 3F) and is located between the gate 13 and the isolation structure 12ar.

As shown in FIG. 3E, the recess 39b, in the lateral direction, has a boundary 39bf closer to the gate 13 and a boundary 39bl farther from the gate 13. In this embodiment, the boundary 39bf of the recess 39b, in the lateral direction, does not extend into an area P beneath the dielectric layer 13a of the gate 13. The boundary 39bl of the recess 39b, in the lateral direction, does not extend beneath the isolation structure 12ar.

As shown in FIG. 3E, the recess 39b of this embodiment, from the cross-section view, has a depth Db, which is defined as a distance extending from the upper surface 11a of the semiconductor substrate 11 downward in the vertical direction. The isolation structure 12ar of this embodiment, from the cross-section view, has a depth H, which is also defined as a distance extending from the upper surface 11a of the semiconductor substrate 11 downward in the vertical direction. It is noteworthy that the depth Db of the recess 39b is not deeper than the depth H of the isolation structure 12ar. In other words, in one embodiment, Db≤H. In another embodiment, the depth Db of the recess 29b is not deeper than 5000 angstrom (Å) ($10^{-10}$ m). That is, in this embodiment, Db≤5000 angstrom (Å).

It is noteworthy that the present invention is further different from the prior art in that: as shown in FIG. 3F, from the cross-section view, there is a vertical connection portion 352 formed by the implantation at the boundary 39bf of the recess 39b in the vertical direction. This vertical connection portion 352 connects the LDD 14r which is at the same side as the drain 35b to the drain 35b.

It is noteworthy that, as shown in FIG. 3F, from the cross-section view, the LDD 141 which is at the same side as the source 15a is laterally in contact with the source 15a. On the other hand, from the cross-section view, the LDD 14r which is at the same side as the drain 35b is not laterally in contact with the drain 35b.

Figure 3G:
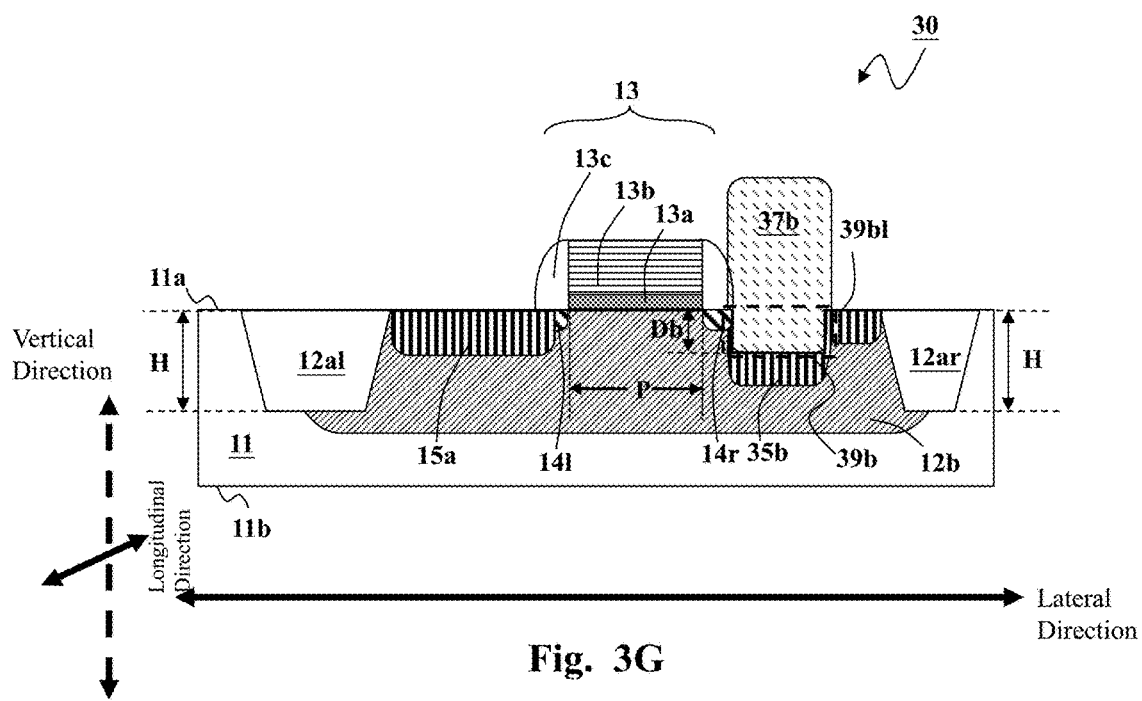

Next, as shown in FIG. 3G, a conductive material 37b is filled into the recess 39b, to form a contact.

FIG. 3G shows a cross-section view of the MOS device 30 after the above manufacturing process steps are completed.

In this embodiment, because the LDD 14r which is at the same side as the drain 35b is not laterally in contact with the drain 35b, the amount of N-type impurities in the drain 35b which diffuse to the LDD 14r are reduced dramatically. As a consequence, when an electric field is applied to the MOS device 30, the hot carrier effect will be suppressed, whereby the substrate current flowing from the drain to the semiconductor substrate 11 due to hot carrier effect is suppressed. Hence, the threshold voltage of the MOS device 30 will not deviate from the designed value.

Figure 6:
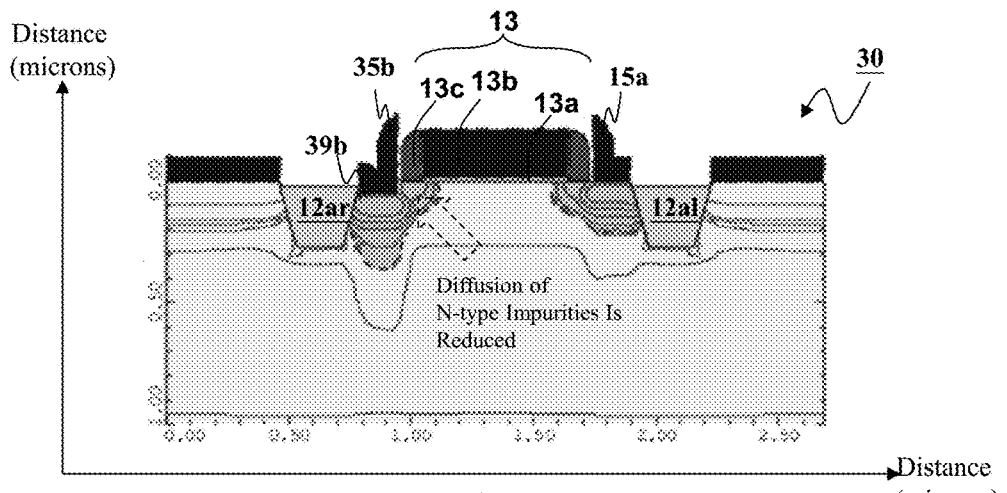
FIG. 6 shows a diagram of dopant concentration profile of a MOS device 30 according to the present invention, which corresponds to FIG. 3G.

Please refer to FIG. 3G in conjugation with FIGS. 4 and 6. FIG. 6 shows a diagram of dopant concentration profile of the MOS device 30 corresponding to FIG. 3G. As shown in FIG. 4, in the prior art N-type MOS device 10, the amount of N-type impurities in the source 15a which diffuse to the LDD 14 connected to the source 15a and the amount of N-type impurities in the drain 15b which diffuse to the LDD 14 connected to the drain 15b are relatively higher (as indicated by the hollow arrow in solid line shown in FIG. 4).

However, note that the present invention is different from the prior art in that: in the MOS device 30, the amount of N-type impurities in the drain 35b which diffuse to the LDD 14r are dramatically reduced (as indicated by the hollow arrow in dashed line shown in FIG. 6).

An N-type device is illustrated as an example in the above embodiment of FIGS. 3A-3G, but the same concept is certainly applicable to a P-type device.

Figure 7:
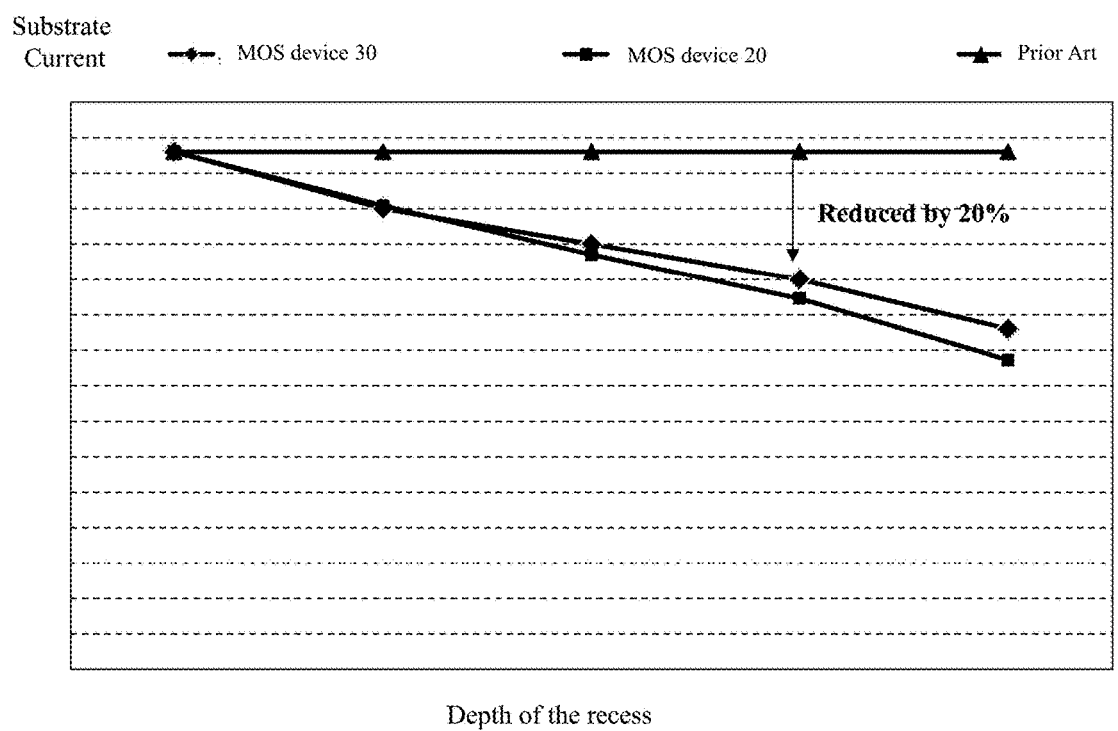
FIG. 7 shows that the present invention, as compared to the prior art, is capable of reducing substrate current.

Please refer to FIG. 7, which shows that the present invention, as compared to the prior art, is capable of reducing substrate current. The present invention provides two types of MOS devices and corresponding manufacturing methods thereof: the MOS device 20 having two recesses and the MOS device 30 having only one recess. According to FIG. 7, it is apparent that the MOS devices 20 and 30 of the present invention, as compared to the prior art, can reduce the substrate current by 20% or more. Note that the prior art device does not have any recess, i.e., the depth of the recess of the prior art device is 0, and in FIG. 7, different data points of the prior art device do not mean that the prior art device has any recess, but are provided for easier comparison of the substrate current only.

Figure 8:
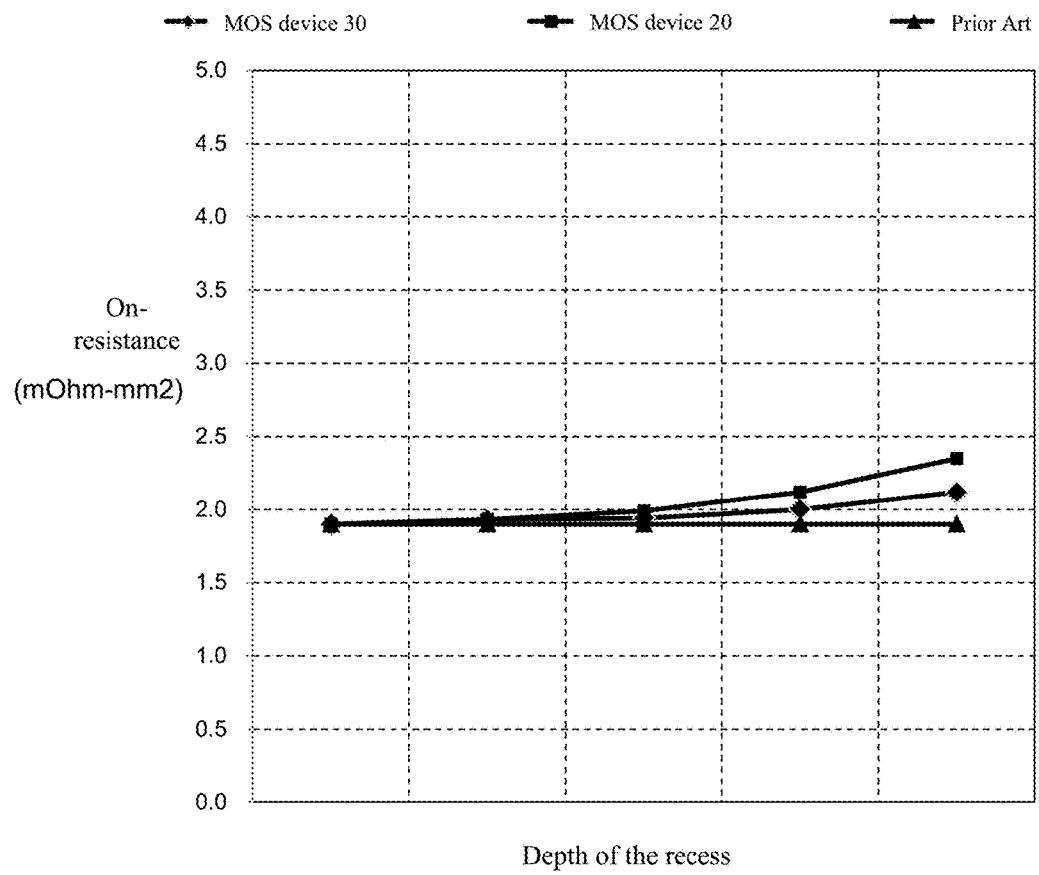
FIG. 8 shows a comparison of the ON-resistances of the present invention and the prior art N-type MOS device.

Further, please refer to FIG. 8, which shows ON-resistances of the MOS devices 20 and 30 according to the present invention and the ON-resistance of the prior art device. As shown in FIG. 8, the MOS devices 20 and 30 of the present invention can reduce the substrate current without compromising the ON-resistance. According to FIG. 8, the ON-resistance of the MOS devices 20 and the ON-resistance of the MOS devices 30 of the present invention are comparable to the ON-resistance of the prior art, showing that the MOS devices 20 and 30 of the present invention can reduce the substrate current without significantly affecting the ON-resistance.

The present invention has been described in considerable detail with reference to certain preferred embodiments thereof. It should be understood that the description is for illustrative purpose, not for limiting the scope of the present invention. An embodiment or a claim of the present invention does not need to achieve both the objectives or advantages of the present invention. The title and abstract are provided for assisting searches but not for limiting the scope of the present invention. Those skilled in this art can readily conceive variations and modifications within the spirit of the present invention. For example, other manufacturing process steps or structures which do not affect the characteristics of the devices, such as a deep-well region, etc., can be added. For another example, the lithography process is not limited to photolithography; it can be electron beam lithography, X-ray lithography or other methods. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover both such and other modifications and variations, which should be interpreted to fall within the scope of the following claims and their equivalents.

What is claimed is:

1. A manufacturing method of a metal oxide semiconductor (MOS) device, comprising the steps of:
    providing a semiconductor substrate, and forming a plurality of isolation structures parallel to each other in a longitudinal direction of the semiconductor substrate to define a device region, the semiconductor substrate having an upper surface and a lower surface opposing to each other in a vertical direction;
    forming a gate in the device region and on the upper surface of the semiconductor substrate;
    etching the upper surface in the longitudinal direction, so that a first recess and a second recess are formed on the upper surface, wherein the first recess and the second recess are parallel to each other in the longitudinal direction;
    forming two lightly doped diffusions (LDDs) having a same conductive type as the source and the drain at different sides below the gate, respectively;
    forming a source and a drain at different sides of the gate;
    forming two vertical connection portions which connect the two LDDs to the source and the drain, respectively; and
    filling a conductive material into the first recess and the second recess, respectively, to form contacts;
    wherein, viewing from a cross-section view, the first recess and the second recess are at different sides of the gate and are located between the gate and one of the isolation structures, respectively;

wherein, the first recess, in a lateral direction, has a first boundary closer to the gate and a second boundary farther from the gate, and the second recess, in the lateral direction, has a third boundary closer to the gate and a fourth boundary farther from the gate, the vertical connection portion of the source being formed at the first boundary of the first recess in the vertical direction, while the vertical connection portion of the drain being formed at the third boundary of the second recess in the vertical direction;

wherein, the first boundary and the third boundary, in the lateral direction, do not extend beneath the gate;

wherein, from the cross-section view, the first recess and the second recess have respective depths, and the two LDDs have a depth, and the depths of the first recess and the second recess are both deeper than the depth of the two LDDs;

wherein, depth is defined as a distance extending from the upper surface of the semiconductor substrate downward in the vertical direction; and wherein, the longitudinal direction, vertical direction and lateral direction are perpendicular to one another.

2. The manufacturing method of the MOS device of claim 1, wherein the two LDDs are not laterally in contact with the source and the drain, respectively.

3. The manufacturing method of the MOS device of claim 1, wherein the respective depths of the first recess and the second recess are not deeper than a depth of the isolation structures.

4. The manufacturing method of the MOS device of claim 1, wherein the respective depths of the first recess and the second recess are not deeper than 5000 Å.

5. A manufacturing method of a metal oxide semiconductor (MOS) device, comprising the steps of:

providing a semiconductor substrate, and forming a plurality of isolation structures parallel to each other in a longitudinal direction of the semiconductor substrate to define a device region, the semiconductor substrate having an upper surface and a lower surface opposing to each other in a vertical direction;

forming a gate in the device region and on the upper surface of the semiconductor substrate;

etching the upper surface in the longitudinal direction, so that a recess is formed on the upper surface;

forming two lightly doped diffusions (LDDs) having a same conductive type as the source and the drain at different sides below the gate, respectively;

forming a source and a drain at different sides of the gate;

forming a vertical connection portion which connects one of the two LDDs to the drain; and filling a conductive material into the recess to form a contact;

wherein, viewing from a cross-section view, the recess is at one side of the gate and is located between the gate and one of the isolation structures;

wherein, the recess, in a lateral direction, has a first boundary closer to the gate and a second boundary farther from the gate, the vertical connection portion being formed at the first boundary of the recess in the vertical direction, and wherein the first boundary, in the lateral direction, does not extend beneath the gate;

wherein the recess has a depth which is deeper than a depth of one of the two LDDs which is at the same side as the drain;

wherein, depth is defined as a distance extending from the upper surface of the semiconductor substrate downward in the vertical direction; and wherein, the longitudinal direction, vertical direction and lateral direction are perpendicular to one another.

6. The manufacturing method of the MOS device of claim 5, wherein one of the two LDDs which is at the same side as the drain is not laterally in contact with the drain, and wherein another one of the two LDDs which is at the same side as the source is laterally in contact with the source.

7. The manufacturing method of the MOS device of claim 5, wherein the depth of the recess is not deeper than a depth of the isolation structures.

8. The manufacturing method of the MOS device of claim 5, wherein the depth of the recess is not deeper than 5000 Å.

* * * * *